(12) United States Patent
Takano (10) Patent No.: US 8,975,160 B2
(45) Date of Patent: Mar. 10, 2015

(54) MANUFACTURING METHOD FOR SEMICONDUCTOR DEVICE

(71) Applicant: Kabushiki Kaisha Toshiba, Tokyo (JP)

(72) Inventor: Eiji Takano, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/015,164

(22) Filed: Aug. 30, 2013

(65) Prior Publication Data
US 2014/0287567 A1 Sep. 25, 2014

(30) Foreign Application Priority Data

Mar. 21, 2013 (JP) ................. 2013-058229

(51) Int. Cl.
| | | |
|---|---|---|
| *H01L 21/30* | (2006.01) | |
| *H01L 21/762* | (2006.01) | |
| *H01L 21/683* | (2006.01) | |
| *H01L 21/20* | (2006.01) | |

(52) U.S. Cl.
CPC ...... *H01L 21/76251* (2013.01); *H01L 21/6836* (2013.01); *H01L 21/6835* (2013.01); *H01L 21/2007* (2013.01); *H01L 2221/68327* (2013.01)
USPC ............................. 438/459; 438/455; 438/458

(58) Field of Classification Search
CPC ................. H01L 21/6835; H01L 2221/68327; H01L 21/6836; H01L 21/2007
USPC .................................................. 438/455, 459
See application file for complete search history.

(56) References Cited

U.S. PATENT DOCUMENTS

| | | | | |
|---|---|---|---|---|
| 5,668,045 A | * | 9/1997 | Golland et al. | 438/459 |
| 6,342,433 B1 | * | 1/2002 | Ohmi et al. | 438/455 |
| 6,864,534 B2 | * | 3/2005 | Ipposhi et al. | 257/627 |
| 7,195,988 B2 | * | 3/2007 | Nemoto et al. | 438/459 |
| 7,713,842 B2 | * | 5/2010 | Nishihata et al. | 438/459 |
| 7,892,947 B2 | * | 2/2011 | Bradl et al. | 438/459 |
| 2001/0038153 A1 | * | 11/2001 | Sakaguchi | 257/797 |
| 2009/0017323 A1 | * | 1/2009 | Webb et al. | 428/521 |
| 2011/0217826 A1 | * | 9/2011 | Sakurada | 438/462 |
| 2013/0161795 A1 | * | 6/2013 | Owada | 257/620 |

FOREIGN PATENT DOCUMENTS

| | | |
|---|---|---|
| JP | 2010-287723 A | 12/2010 |
| JP | 2011-146457 A | 7/2011 |

\* cited by examiner

*Primary Examiner* — Bac Au
(74) *Attorney, Agent, or Firm* — Patterson & Sheridan LLP (57) ABSTRACT

According to one embodiment, a first adhesive layer is formed on one major surface of a first substrate. The first substrate and a second substrate are adhered using a second adhesive layer that has thermosetting properties and covers the first adhesive layer, wherein a bonding strength between the second substrate is greater than a bonding strength between the second substrate and the first adhesive layer. The other major surface of the first substrate is polished, and the first substrate is thinned. A physical force is then applied to peripheral parts of the second adhesive layer, and a circular notched part is formed along the outer perimeter of the second adhesive layer to separate the first substrate and the second substrate at the interface between the first adhesive layer and the second adhesive layer.

20 Claims, 5 Drawing Sheets

FIG. 5D

MANUFACTURING METHOD FOR SEMICONDUCTOR DEVICE

CROSS-REFERENCE TO RELATED APPLICATION

This application is based upon and claims the benefit of priority from Japanese Patent Application No. 2013-058229, filed Mar. 21, 2013, the entire contents of which are incorporated herein by reference.

FIELD

Embodiments described herein relate generally to a manufacturing method for a semiconductor device.

BACKGROUND

Conventionally, there is a step in the manufacture of semiconductor devices in which substrates such as semiconductor wafers (device substrate) and support substrates are bonded together with an adhesive that retains the device substrate for processing. After performing the processing on the device substrate, the support substrate is then separated from the device substrate. The support substrates are typically removed from the device substrate by peeling the support substrate from the device substrate after thinning the device substrate in a polishing process.

As there is the need to stably support the device substrate on the support substrate during polishing, an adhesive with a relatively strong bonding strength is used for bonding together the device substrate and the support substrate. However, the use of the high bonding strength adhesive creates a challenge in separation, such that increased time and labor are involved in peeling the device substrate from the support substrate.

DETAILED DESCRIPTION

Embodiments provide a manufacturing method for a semiconductor device that can peel a substrate from a support substrate in a short amount of time.

In general, according to one embodiment, the manufacturing method of the semiconductor device according to the embodiment is described with reference to the attached drawings. The embodiments described herein are not intended to be limiting of the present invention.

According to one embodiment of the present invention, a manufacturing method for a semiconductor device is provided. In the manufacturing method for a semiconductor device, a first adhesive layer is formed on one major surface of a first substrate. The first substrate and a second substrate are adhered using a second adhesive layer that has thermosetting properties and covers the first adhesive layer, wherein a bonding strength between the second substrate is greater than a bonding strength between the second substrate and the first adhesive layer. The other major surface of the first substrate is polished, and the first substrate is thinned. A physical force is applied to the peripheral parts of the second adhesive layer, and a circular (circumferential) notched part is formed along the outer perimeter of the second adhesive layer. The first substrate side is fixed, the interface of the first adhesive layer and the second adhesive layer is peeled, and the second substrate is separated from the first substrate. The outer perimeter of the notched part is positioned on the inside of the outer perimeter of the second adhesive layer; the inner perimeter of the notched part is positioned inside of the outer perimeter of the first adhesive layer and is formed by leaving the second adhesive layer between the notched part and the second substrate.

(First Embodiment)

The following describes a first substrate on which semiconductor chips and integrated circuits are formed (henceforth, a "device substrate") and a second substrate (henceforth, a "support substrate") are bonded. The device substrate is then separated from the support substrate after polishing (thinning) the device substrate supported by the support substrate.

FIGS. 1A to 1D and 2A to 2C are schematic cross-sectional diagrams that show the manufacturing method of the semiconductor device according to the first embodiment. FIGS. 1A to 1D and 2A to 2C schematically show the side cross-sections of the peripheral parts of a device substrate 1 and a support substrate 3 and their locations.

In the manufacturing method for the semiconductor device according to the first embodiment, the device substrate 1 and the support substrate 3 (shown in FIGS. 1B-1D) are prepared. Here, the device substrate 1 is a semiconductor wafer. The support substrate 3 is made from glass, silicon, and the like, and is a disc-like substrate with a diameter and thickness that are nearly the same as those of the device substrate 1. The configuration of the support substrate 3, such as the diameter and thickness, is not limited to the configuration shown.

Figure 1A:
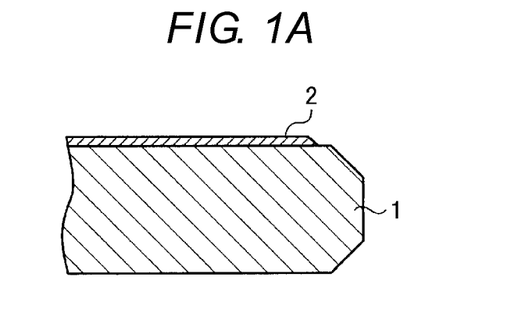
FIGS. 1A to 1D are schematic cross-sectional diagrams that show a manufacturing method of a semiconductor device according to a first embodiment.

As shown in FIG. 1A, a first adhesive layer 2 is applied on a first major surface (here, the upper surface) of the device substrate 1. For example, a first adhesive layer 2 is formed by applying an adhesive that has thermal plasticity, which uses polypropylene, polyethylene, polystryrene, acrylic, polyethylene terephthalate, fluorine resin, and urethane resin, etc. on the first major surface of the device substrate 1.

At this time, an adhesive with thermal plasticity is applied to the region except for the peripheral parts of the upper surface of the device substrate 1. For example, an adhesive that has thermal plasticity is applied to the first major surface of the device substrate 1 leaving a circular (circumferential) exclusion region in the peripheral parts of the device substrate 1 of about 3 mm in width from the outer perimeter (in plan view) where the adhesive is not applied. The first adhesive layer 2 may also be a double-sided tape formed from a material having thermal plasticity, instead of the application of an adhesive having thermal plasticity.

Figure 1B:
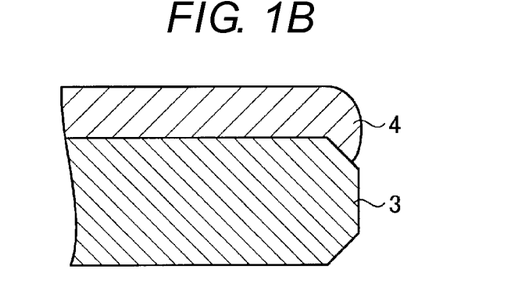

Next, as shown in FIG. 1B, a second adhesive layer 4 is applied on a first major surface (here, the upper surface) of the support substrate 3. Here, for example, a second adhesive layer 4 is formed by applying an adhesive that has thermosetting properties and that uses phenol resin, melamine, glass fiber-reinforced plastic, etc. on the first major surface of the support substrate 3.

At this time, an adhesive that is thicker than the first adhesive layer 2 and that has thermosetting properties is applied on the entire first major surface of the support substrate 3. Also, the second adhesive layer 4 is formed by applying an adhesive whose bonding strength with the first adhesive layer 2 is weaker than the bonding strength with the support substrate 3 and the device substrate 1.

Figure 1C:
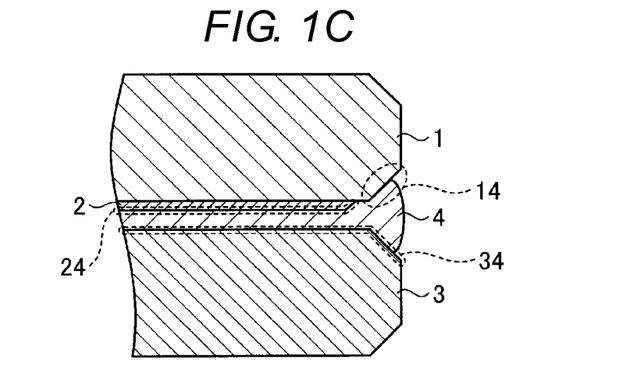

Next, as shown in FIG. 1C, the surface of the first adhesive layer 2 that is installed on a second major surface (here, the lower surface) of the device substrate 1 (whose front and back are reversed from FIG. 1) and the surface of the second adhesive layer 4 are pressed together, and the device substrate 1 and support substrate 3 are bonded.

The surface area of the second adhesive layer 4 is larger than the surface area of the first adhesive layer 2, and the second adhesive layer 4 is formed to be thicker than the first adhesive layer 2. For this reason, the second adhesive layer 4 covers the surface of the first adhesive layer 2 and covers the peripheral parts of the device substrate 1 (exclusion region) where the first adhesive layer 2 is not formed.

Here, the bonding strength of an interface 24 between the second adhesive layer 4 and first adhesive layer 2 is relatively weak, but the bonding strength of an interface 14 of the second adhesive layer 4 and the device substrate 1 and the bonding strength of an interface 34 with the support substrate 3 are greater than the bonding strength of the interface 24 between the second adhesive layer 4 and the first adhesive layer 2. Therefore, the device substrate 1 is strongly adhered to the support substrate 3 by the second adhesive layer 4 that lies between the device substrate 1 and the support substrate 3 in the peripheral portions thereof.

Figure 1D:
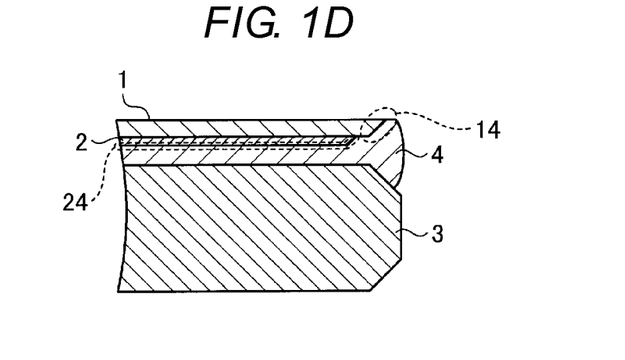

Next, as shown in FIG. 1D, the second major surface of the device substrate 1 where the first adhesive layer 2 is not formed (here, the upper surface) is polished, and the device substrate 1 is thinned. For example, after polishing the second major surface of the device substrate 1 with a polishing device, for example by conducting CMP (Chemical Mechanical Polishing) on the polished surface, the device substrate 1 is thinned to a thickness of around 50 μm. At this time, as shown in FIG. 1D, the interface 14 between the device substrate 1 and the second adhesive layer 4 remains.

Then, a processing treatment is conducted on the device substrate 1 and forms a TSV (Through Silicon Via), wiring, and connection terminals, etc. (not shown in the figures). The steps for conducting processing treatment include multiple heat treatment steps. In such heat treatment steps, the first adhesive layer 2 having thermal plasticity softens. However, the second adhesive layer 4 with a thermosetting property will not soften but, on the contrary, hardens.

Therefore, even when the heat treatment steps are repeated and the first adhesive layer 2 repeats softening and hardening, since the second adhesive layer 4 strongly retains the device substrate 1, deformation of the device substrate 1 due to the heat treatment steps can be suppressed. Thus, a decline in the yield rate caused by the deformation of the device substrate 1 can be suppressed.

Next, the device substrate 1 is peeled from the support substrate 3. Here, the device substrate 1, as shown in FIG. 1D, is strongly bonded with the support substrate 3 at the peripheral parts (the interface 14 between the device substrate 1 and the second adhesive layer 4) by the second adhesive layer 4.

Figure 2A:
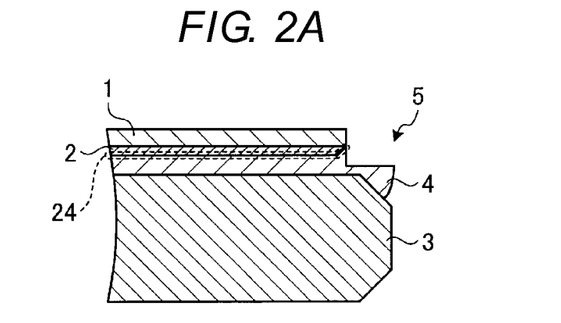
FIGS. 2A to 2C are schematic cross-sectional diagrams that show a manufacturing method of a semiconductor device according to the first embodiment.

So, as shown in FIG. 2A, by applying a tool and physical (mechanical) force to the peripheral parts of the second adhesive layer 4 and forming a circular (circumferential) notched part 5 along the outer perimeter of the second adhesive layer 4, the region including the interface 14 between the device substrate 1 and second adhesive layer 4 is removed.

Specifically, the region including the interface 14 between the device substrate 1 and the second adhesive layer 4 is removed with a blade or other tool (not shown in the diagrams) or by selectively polishing the peripheral parts of the device substrate 1 and the second adhesive layer 4. Additionally, the region including the interface 14 between the device substrate 1 and the second adhesive layer 4 can be removed from a minor surface of the device substrate 1 (here, the side surface) and the second adhesive layer 4 by polishing the peripheral parts of the device substrate 1 and the second adhesive layer 4.

Also, in the case of removing the region including the interface 14 between the device substrate 1 and the second adhesive layer 4, the second adhesive layer 4 is left on the peripheral parts of the support substrate 3. The bottom surface of the notched part 5 is configured to not reach the surface of the support substrate 3. In this manner, reuse of the support substrate 3 becomes possible by forming the notched part 5 without damaging the support substrate 3.

Figure 2B:
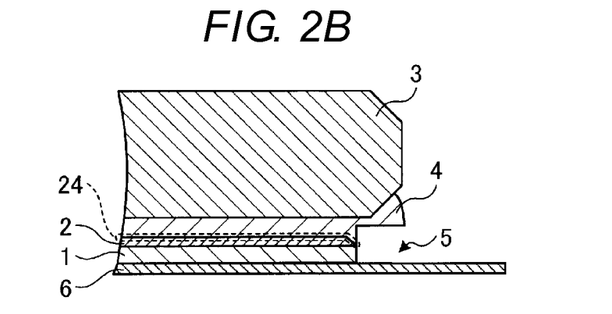

Next, as shown in FIG. 2B, the front and back of a structure whereon the device substrate 1 and support substrate 3 are adhered are reversed from the position shown in FIG. 2A, and the second major surface of the device substrate 1 (here, the lower surface) is adhered to a peeling member 6. Here, the peeling member 6 has a bonding strength with the device substrate 1 that is stronger than the bonding strength between the first adhesive layer 2 and the second adhesive layer 4.

Figure 2C:
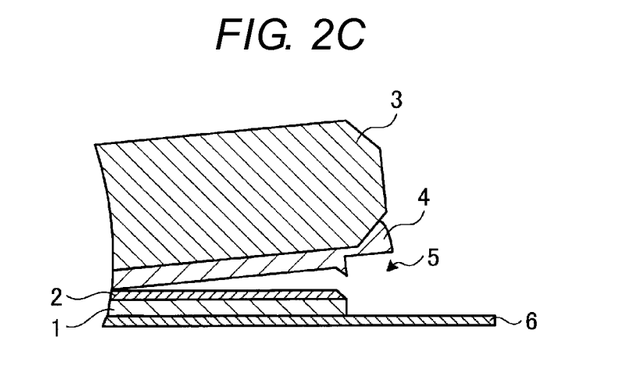

At this time, the device substrate 1 and the support substrate 3 are bonded by a relatively weak bonding strength at the interface 24 between the first adhesive layer 2 and the second adhesive layer 4. For this reason, by peeling the support substrate 3 from the device substrate 1 with a peeling strength that is greater than the relatively weak bonding strength between the first adhesive layer 2 and the second adhesive layer 4, as shown in FIG. 2C, the device substrate 1 can be easily peeled from the support substrate 3 in a short amount of time.

Then, after removing the peeling member 6 from the device substrate 1, the first adhesive layer 2 that is left on the device substrate 1 is washed with a solvent, and the operation of peeling the device substrate 1 from the support substrate 3 is concluded.

Meanwhile, in the first embodiment, after a first adhesive layer 2 is formed on the device substrate 1 side, and the second adhesive layer 4 is formed on the support substrate 3 side, the first adhesive layer 2 and the second adhesive layer 4 are abutted, and the device substrate 1 and the support substrate 3 are adhered. However, this is one example, and various modifications are possible.

For example, after the first adhesive layer 2 is formed on one major surface of the device substrate 1, the second adhesive layer 4 is formed so as to cover the surface of the first adhesive layer 2, after which the support substrate 3 is abutted against the surface of the second adhesive layer 4, and the device substrate 1 and the support substrate 3 can be adhered.

Also, the second adhesive layer 4 can be formed on a major surface of the support substrate 3, a first adhesive layer 2, covering an area that is smaller than the second adhesive layer 4, can be formed on the surface of the second adhesive layer 4, and the major surface of the device substrate 1 can be abutted against the surface of the first adhesive layer 2 to adhere the device substrate 1 and support substrate 3.

In the first embodiment, the device substrate 1 and the support substrate 3 are adhered via the second adhesive layer 4, which is equipped with thermosetting properties and covers the first adhesive layer 2 that is formed on one major surface of the device substrate 1. With this, when heat processing is done on the device substrate 1, since the second adhesive layer 4 suppresses the deformation of the device substrate 1, a decrease in the yield rate caused by the deformation of the device substrate 1 can be suppressed.

Also, in the first embodiment, by applying physical force to the peripheral parts of the second adhesive layer 4 that is strongly bonded to the device substrate 1 and the support substrate 3, the region that includes the interface 14 between the device substrate 1 and the second adhesive layer 4 is removed. Thus, the interface 14 part between the device substrate 1 that strongly bonds the device substrate 1 and the support substrate 3 and the second adhesive layer 4 can be removed in a short amount of time.

According to the embodiment, just by applying a relatively small peeling force at the interface 24 between the first adhesive layer 2 and the second adhesive layer 4 to the support substrate 3, the device substrate 1 can be easily removed from the support substrate 3 along the interface 24 between the first adhesive layer 2 and the second adhesive layer 4 in a short amount of time. Meanwhile, the form of the notched part 5 shown in FIG. 2A-FIG. 2C is one example. The following embodiment describes an example of a variant form of the notched part 5.

(Second Embodiment)

Figure 3A:
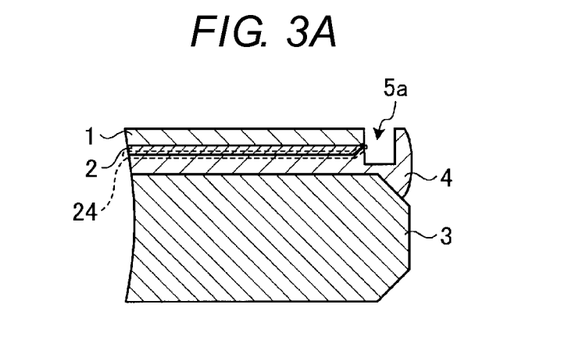
FIGS. 3A to 3C are schematic cross-sectional diagrams that show a manufacturing method of a semiconductor device according to the second embodiment.
Figure 3B:
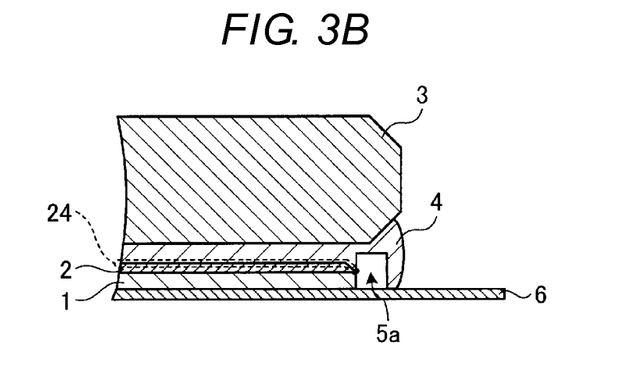
Figure 3C:
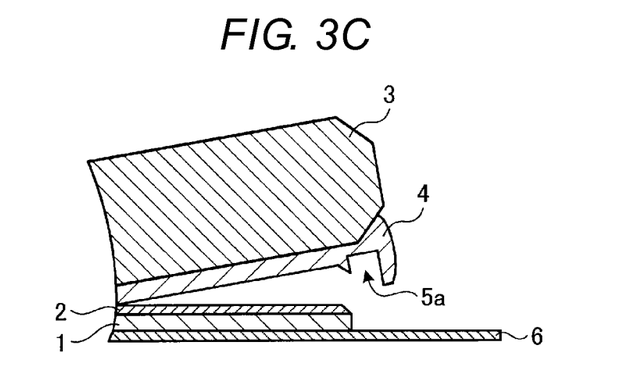

FIGS. 3A to 3C are schematic cross-sectional diagrams that show the manufacturing method of the semiconductor device according to the second embodiment. In the manufacturing method of the semiconductor device according to the second embodiment, the manufacturing steps that are carried out after the manufacturing steps shown in FIGS. 2A to 2C differ from the first embodiment and FIGS. 3A to 3C show the manufacturing steps carried out after the manufacturing steps shown in FIGS. 1A to 1D. Also, the components that are the same those as shown in FIGS. 1A to 1D and 2A to 2C are given the same reference symbols as those used in FIGS. 1A to 1D and 2A to 2C, and their repetitive descriptions have been omitted for brevity.

In the second embodiment, as shown in FIG. 3A, after thinning the device substrate 1, a circular (circumferential) groove is formed along the outer perimeter of the second adhesive layer 4 as the notched part 5a on the peripheral parts of one major surface (here, the upper surface) of the device substrate 1.

Specifically, polishing starts from the upper surface of the peripheral parts of the device substrate 1 towards the support substrate 3, and polishing ends before the bottom surface of the groove reaches the support substrate 3 to form the notched part 5a. Similar to the first embodiment, the reuse of the support substrate 3 becomes possible.

At this time, the notched part 5a is formed so that the inner perimeter of the notched part 5a has a circular (circumferential) form in plan view that coincides with the outer perimeter of the second adhesive layer 4 (or, so that the notched part 5a will be radially inward of the outer perimeter of the second adhesive layer 4) and so that the outer perimeter of the notched part 5a will be positioned inside of the outer perimeter of the second adhesive layer 4. With this, the region that includes the interface 14 (refer to FIGS. 1A to 1D) between the device substrate 1 and the second adhesive layer 4 is removed. In this manner, the device substrate 1 and the support substrate 3 are bonded by the interface 24 between the first adhesive layer 2 and the second adhesive layer 4 with a relatively weak bonding strength.

The notched part 5a is provided wherein the outer perimeter part of the second adhesive layer 4 is left without polishing. In this manner, since the region to be polished to remove the region that includes the interface 14 (refer to FIGS. 1A to 1D) between the device substrate 1 and the second adhesive layer 4 can be smaller as compared to the notched part 5 of FIG. 2A, the time necessary for polishing to form the notched part 5a can be shortened.

Next, as shown in FIG. 3B, the front and back of a structure wherein the device substrate 1 and the support substrate 3 are adhered are reversed from the position shown in FIG. 3A, and the other major surface of the device substrate 1 (here, the lower surface) is adhered to a peeling member 6.

By removing the support substrate 3 from the device substrate 1 with a peeling strength that is greater than the relatively weak bonding strength between the first adhesive layer 2 and the second adhesive layer 4, as shown in FIG. 3C, the device substrate 1 can be easily peeled from the support substrate 3 in a short amount of time.

According to the second embodiment, in order to keep the polishing region narrow for removing the region that includes the interface 14 (refer to FIGS. 1A to 1D) between the device substrate 1 and second adhesive layer 4, the time required for polishing to form the notched part 5a can be shortened. Therefore, the operating time for removing the device substrate 1 from the support substrate 3 can be further shortened.

(Third Embodiment)

Figure 4A:
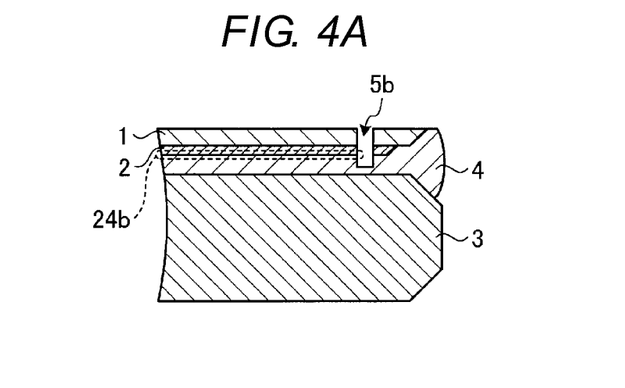
FIGS. 4A to 4C are schematic cross-sectional diagrams that show a manufacturing method of a semiconductor device according to the third embodiment.
Figure 4B:
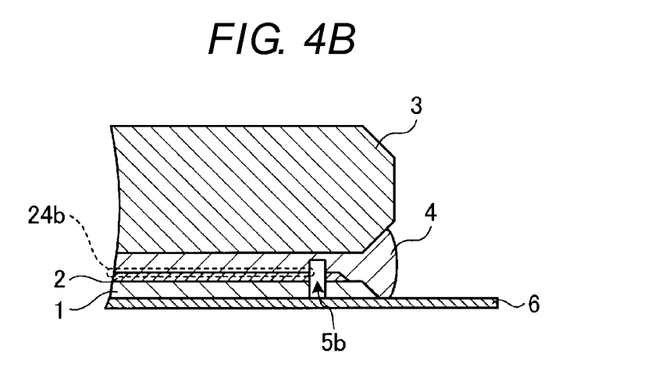
Figure 4C:
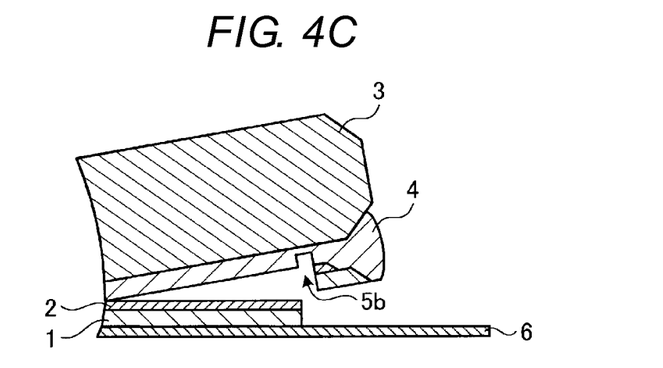

FIGS. 4A to 4C are schematic cross-sectional diagrams that show the manufacturing method of the semiconductor device according to a third embodiment. In the manufacturing method of the semiconductor device according to the third embodiment, the manufacturing steps that are carried out after the manufacturing steps shown in FIGS. 2A to 2C differ from the first embodiment and FIGS. 4A to 4C show the manufacturing steps carried out after the manufacturing steps shown in FIGS. 1A to 1D. Also, the components that are the same as those shown in FIGS. 1A to 1D and 2A to 2C are given the same reference symbols as those in FIGS. 1A to 1D and 2A to 2C, and their repetitive descriptions have been omitted for brevity.

In the third embodiment, as shown in FIG. 4A, after thinning the device substrate 1, a circular (circumferential)groove with a diameter that is smaller than the notched part 5a of the second embodiment is formed as a notched part 5b on the peripheral parts of one major surface (here, the upper surface) of the device substrate 1.

Specifically, the notched part 5b is formed so that the inner perimeter and the outer perimeter of the notched part 5b has a circular (circumferential) form in plan view that is positioned inside the perimeter of the device substrate 1 and the second adhesive layer 4. Accordingly, the device substrate 1 and the support substrate 3 become bonded with a relatively weak bonding strength by the interface 24b between the first adhesive layer 2 and the second adhesive layer 4 in the inside of the notched part 5b having a circular (circumferential) form.

The position of formation of such a notched part 5b can be anywhere as long as the outer perimeter of the notched part 5b is inside of the outer perimeter of the first adhesive layer 2, i.e., within the adhesive layer. Thus, according to the notched part 5b, the operation of adjusting the alignment of the position of the formation of the notched part 5b can be done easily and in a short amount of time.

Also, since the width of the notched part 5b seen in the plan view can be further narrowed, the time necessary to form the notched part 5b can be further shortened. Meanwhile, when forming the notched part 5b, polishing also ends before the bottom surface of the groove reaches the support substrate 3. Thus, the reuse of the support substrate 3 becomes possible.

Next, as shown in FIG. 4B, the front and back of a structure wherein the device substrate 1 and support substrate 3 are adhered are reversed from the position shown in FIG. 4A, and the other major surface of the device substrate 1 (here, the lower surface) is adhered to a peeling member 6.

By removing the support substrate 3 from the device substrate 1 with a peeling strength that is greater than the relatively weak bonding strength between the first adhesive layer 2 and the second adhesive layer 4, as shown in FIG. 3C, the device substrate 1 can be easily peeled from the support substrate 3 in a short amount of time.

According to the third embodiment, the operation of adjusting the alignment of the position of the formation of the notched part 5b can be done easily and in a short amount of time. Additionally, by further narrowing the width of the notched part 5b seen in the plan view, the formation time for the notched part 5b can be shortened. Therefore, the operation time for removing the device substrate 1 from the support substrate 3 can be further shortened.

(Fourth Embodiment)

FIGS. 5A to 5D are schematic cross-sectional diagrams that show the sequence or steps of the manufacturing method of the semiconductor device according to a fourth embodiment. In the manufacturing method of the semiconductor device according to the fourth embodiment, the manufacturing steps that are carried out after the manufacturing steps shown in FIGS. 2A to 2C differ from the first embodiment. For this reason, FIGS. 5A to 5D show the manufacturing steps carried out after the manufacturing steps shown in FIGS. 1A to 1D. Also, the components that are the same as those shown in FIGS. 1A to 1D and 2A to 2C are given the same reference symbols as those in FIGS. 1A to 1D and 2A to 2C, and their repetitive descriptions have been omitted for brevity.

Figure 5A:
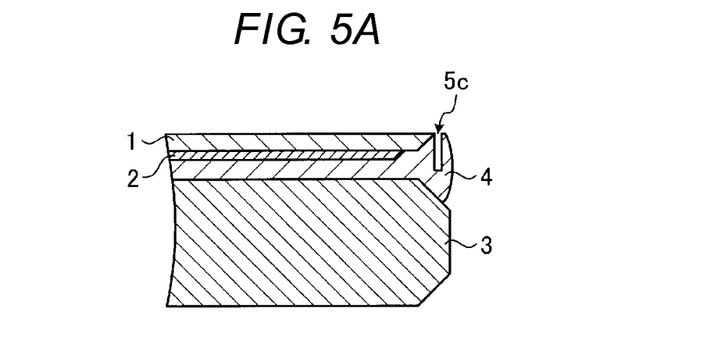
FIGS. 5A to 5D are schematic cross-sectional diagrams that show a manufacturing method of a semiconductor device according to the fourth embodiment.

In the fourth embodiment, as shown in FIG. 5A, a circular (circumferential) groove along the outer perimeter of the second adhesive layer 4 is formed as the notched part 5c between the outer perimeter of the device substrate 1 in the plan view and the outer perimeter of the second adhesive layer 4.

Specifically, the notched part 5c is formed so that the inner perimeter of the notched part 5c with a circular (circumferential) form in the plan view matches the outer perimeter of the device substrate 1 and so that the outer perimeter of the notched part 5c is positioned inwardly of the outer perimeter of the second adhesive layer 4. Additionally, when forming the notched part 5c, polishing also ends before the bottom surface of the groove reaches the support substrate 3. Thus, the reuse of the support substrate 3 becomes possible.

Figure 5B:
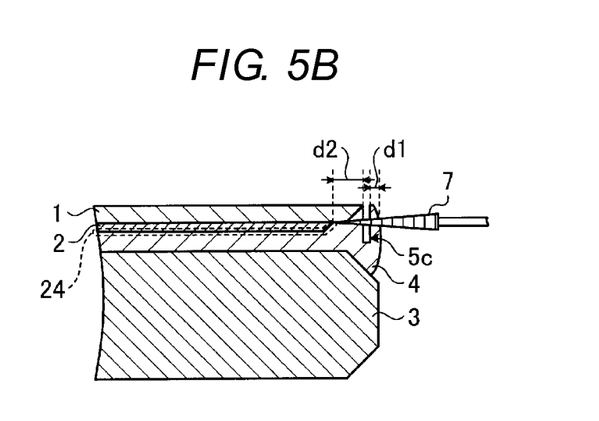

Next, as shown in FIG. 5B, a blade 7 is inserted laterally from the outer perimeter surface of the second adhesive layer 4 towards the interface between the device substrate 1 and the first adhesive layer 2. The blade 7 can be inserted from the outer perimeter surface of the second adhesive layer 4 towards the interface 24 between the first adhesive layer 2 and the second adhesive layer 4.

Here, at the peripheral parts of the second adhesive layer 4, the notched part 5c is formed before inserting the blade 7. Accordingly, the peripheral part of the second adhesive layer 4, which has become extremely thin-walled and wherein the width from the outer surface of the second adhesive layer 4 to the outer surface of the notched part 5c is d1 and the width from the inner surface of the notched part 5c to the first adhesive layer 2 is d2, can be fractured with the blade 7.

Therefore, the tip of the blade 7, which cannot easily reach the first adhesive layer 2 if the notched part 5c is not formed, can easily reach the first adhesive layer 2. Accordingly, the device substrate 1 and the support substrate 3 become bonded with a relatively weak bonding strength by the interface 24 between the first adhesive layer 2 and the second adhesive layer 4.

Figure 5C:
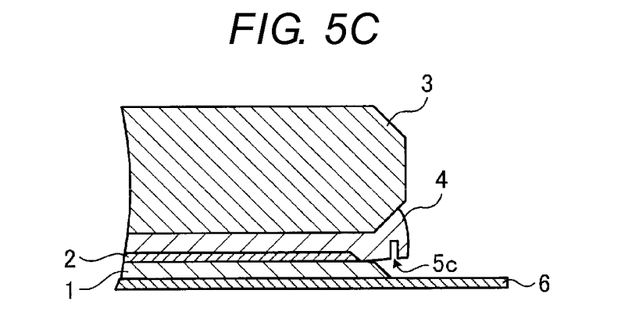

Next, as shown in FIG. 5C, the front and back of a structure wherein the device substrate 1 and the support substrate 3 are adhered are reversed from the position shown in FIG. 5B, and the other major surface of the device substrate 1 (here, the lower surface) is adhered to a peeling member 6.

Figure 5D:
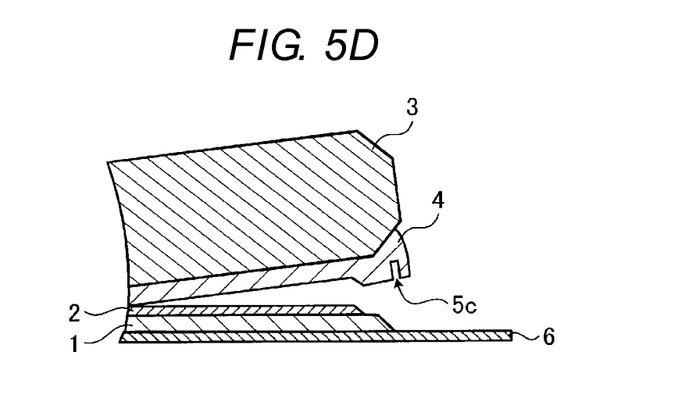

By removing the support substrate 3 from the device substrate 1 with a peeling strength that is greater than the relatively weak bonding strength between the first adhesive layer 2 and the second adhesive layer 4, as shown in FIG. 5D, the device substrate 1 can be easily peeled from the support substrate 3 in a short amount of time.

In the fourth embodiment, by forming the notched part 5c between the outer perimeter of the device substrate 1 and the outer perimeter of the second adhesive layer 4, the tip of the blade 7 can easily reach from the outer perimeter surface of the second adhesive layer 4 to the first adhesive layer 2 in a short amount of time.

Accordingly, the device substrate 1 and the support substrate 3 become bonded with a relatively weak bonding strength by the interface 24 between the first adhesive layer 2 and the second adhesive layer 4. Therefore, with the fourth embodiment, the operation time for peeling the device substrate 1 from the support substrate 3 can be shortened.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method for a semiconductor device comprising:
   applying a first adhesive layer and a second adhesive layer between a first major surface of a first substrate and a second substrate to adhere the first substrate to the second substrate, wherein the first adhesive layer has a bonding strength that is different than a bonding strength of the second adhesive layer;
   thinning a second major surface of the first substrate; and
   applying physical force to a peripheral portion of the second adhesive layer to form a circumferential notched part along an outer perimeter of the second adhesive layer.

2. The method of claim 1, wherein the first adhesive layer is applied to an area of the first substrate that is less than the total surface area of the first major surface of the first substrate.

3. The method of claim 2, wherein second adhesive layer is provided on the first major surface of the second substrate.

4. The method of claim 3, wherein the second adhesive layer covers the first adhesive layer.

5. The method of claim 3, wherein second adhesive layer includes a bond strength that is less than a bond strength between the first adhesive layer and the first substrate.

6. The method of claim 1, wherein the notched part is formed in a region including an interface between the first substrate and the second adhesive layer.

7. The method of claim 6, wherein the notched part is formed without removing the second adhesive layer between the notched part and the second substrate.

8. The method of claim 1, wherein the notched part comprises a groove having an outer perimeter positioned inside of the outer perimeter of the second adhesive layer.

9. The method of claim 8, wherein the notched part is formed without removing the second adhesive layer between the notched part and the second substrate.

10. The method of claim 1, wherein the notched part comprises a groove having an inner perimeter positioned inside of an outer perimeter of the first adhesive layer.

11. The method of claim 10, wherein the notched part is formed without removing the second adhesive layer between the notched part and the second substrate.

12. A manufacturing method for a semiconductor device comprising:
    applying a first adhesive layer to a first major surface of a first substrate;
    applying a second adhesive layer between a first major surface of a second substrate;
    adhering the first adhesive layer to the second adhesive layer to adhere the first substrate to the second substrate, wherein the first adhesive layer has a bonding strength that is different than a bonding strength of the second adhesive layer;
    thinning a second major surface of the first substrate; and
    applying physical force to a peripheral portion of the second adhesive layer to form a circumferential notched part along an outer perimeter of the second adhesive layer.

13. The method of claim 12, wherein the first adhesive layer is applied to an area of the first substrate that is less than the total surface area of the first major surface of the first substrate.

14. The method of claim 13, wherein the second adhesive layer covers the first adhesive layer.

15. The method of claim 13, wherein second adhesive layer includes a bond strength that is less than a bond strength between the first adhesive layer and the first substrate.

16. The method of claim 12, wherein the notched part is formed in a region including an interface between the first substrate and the second adhesive layer.

17. The method of claim 16, wherein the notched part is formed without removing the second adhesive layer between the notched part and the second substrate.

18. The method of claim 12, wherein the notched part comprises a groove having an outer perimeter positioned inside of the outer perimeter of the second adhesive layer.

19. The method of claim 18, wherein the notched part is formed without removing the second adhesive layer between the notched part and the second substrate.

20. A manufacturing method for a semiconductor device comprising:
    forming a first adhesive layer on a first major surface of a first substrate;
    adhering the first substrate and a second substrate using a second adhesive layer that has thermosetting properties and covers the first adhesive layer, wherein a bonding strength between the second substrate is greater than a bonding strength between the second substrate and the first adhesive layer;
    thinning the second major surface of the first substrate;
    applying physical force to peripheral parts of the second adhesive layer to form a circumferential notched part along an outer perimeter of the second adhesive layer; and
    affixing a peeling member to the second major surface of the first substrate side to separate the first substrate and the second substrate along an interface between the first adhesive layer and the second adhesive layer; wherein
    the notched part has an outer perimeter that is positioned inside of the outer perimeter of the second adhesive layer, and an inner perimeter that is positioned inside of an outer perimeter of the first adhesive layer, and is formed by leaving the second adhesive layer between the notched part and the second substrate.

* * * * *